(12) United States Patent
Yu et al.

(10) Patent No.: US 7,423,447 B2
(45) Date of Patent: Sep. 9, 2008

(54) METHOD FOR TESTING LIQUID CRYSTAL DISPLAY PANELS

(75) Inventors: Shan-Jen Yu, Hsin-Chu (TW); Jing-Ru Chen, Hsin-Chu (TW)

(73) Assignee: Au Optronics Corporation, Hsin-chu (TW)

( * ) Notice: Subject to any disclaimer, the term of this patent is extended or adjusted under 35 U.S.C. 154(b) by 0 days.

(21) Appl. No.: 11/837,098

(22) Filed: Aug. 10, 2007

(65) Prior Publication Data

US 2008/0157810 A1    Jul. 3, 2008

(30) Foreign Application Priority Data

Jan. 3, 2007    (TW) .............................. 96100242 A

(51) Int. Cl.
*G01R 31/00*    (2006.01)

(52) U.S. Cl. ...................................... 324/770; 345/214

(58) Field of Classification Search ................. 324/770; 345/214

See application file for complete search history.

(56) References Cited

U.S. PATENT DOCUMENTS

| | | | |
|---|---|---|---|
| 6,794,892 B2 * | 9/2004 | Matsueda .................... | 324/770 |
| 6,878,517 B1 | 4/2005 | Benson | |
| 7,012,439 B2 | 3/2006 | Pinto et al. | |
| 7,381,987 B2 * | 6/2008 | Lee et al. ...................... | 257/57 |
| 2006/0050194 A1 | 3/2006 | Lee et al. | |
| 2007/0086558 A1 * | 4/2007 | Wei et al. ...................... | 377/64 |
| 2008/0048709 A1 * | 2/2008 | Lee et al. ..................... | 324/770 |

* cited by examiner

*Primary Examiner*—Ha Nguyen
*Assistant Examiner*—Richard Isla Rodas
(74) *Attorney, Agent, or Firm*—Thomas, Kayden, Horstemeyer & Risley

(57) ABSTRACT

A method for testing a liquid crystal display panel is provided. The gate drivers are integrated onto the panel. The method includes simultaneously inputting a clock signal, an inverted clock signal, and a pull down signal into clock signal, inverted clock signal, and pull down signal input ends of the gate drivers. Simultaneously input a start pulse into the start pulse input end of the gate drivers to simultaneously turn on the gate lines in the selected area and thus simultaneously turning on the pixels in the selected area. At the same time, input test signals to all the data lines. The method of testing liquid crystal display panels disclosed by the present invention may be performed separately by areas, in which the panel is divided into different sub areas and is tested one area at a time.

19 Claims, 7 Drawing Sheets

METHOD FOR TESTING LIQUID CRYSTAL DISPLAY PANELS

RELATED APPLICATIONS

This application claims priority to Taiwan Patent Application Serial Number 96100242, filed Jan. 3, 2007, which is herein incorporated by reference in its entirety.

BACKGROUND

1. Field of Invention

The present invention relates to a method for testing liquid crystal display panels. More particularly, the present invention relates to a method for testing liquid crystal display panels with gate drivers and gate lines integrated thereon.

2. Description of Related Art

As the market for electronics products continues to grow, the demand for liquid crystal display (LCD) panels grows accordingly. This demand is due to the use of LCDs in electronics products, such as television screens, computer screens, and mobile phone screens. Accordingly, the testing of the LCD panels includes the full contact method and the shorting bar method. The advantage of the full contact method is good testing performance, but the full contact method consumes much time. The shorting bar method may decrease the testing time, because this method divides the gate lines into groups of odd and even gate lines, and connects all the clock signal inputs, all the start pulse inputs, and all the pull down signal inputs together, respectively. Therefore every gate lines does not need an independent signal, and may input a single signal to the connection points mentioned above. Testing may start by enabling all the odd gate lines. After the testing of the odd gate lines is completed, the gate lines are disabled, while the even gate lines are being tested. The testing area is decided by a multiplexer, and the multiplexer simultaneously provides pixel voltages to all the areas.

The shorting bar method is suitable for LCD panels without the gate drivers integrated thereon. Therefore when the gate drivers are integrated on the LCD panel, namely, the gate on array (GOA) arrangement, the shorting bar method may not be applied. The reason is in the shorting bar method, the signal used to enable the gate lines are inputted directly from the inputs of the gate line, which bypasses the gate drivers. When the gate driver is electrically connected to the gate lines, the shorting bar method then will not be able to be inputted from the inputs of the gate lines.

The current testing method of the GOA panels is to input a driving signal into the input of the first gate driver on the panel. When the first gate driver is driven, the first gate line is enabled. The driving signal will be sent from the first gate driver to the second gate driver, while disabling the first gate driver and enabling the second gate driver, and so on.

FIG. 1 is a diagram of the testing method of the GOA panel. If the testing starts sequentially from the top gate line down, when a gate line 101 has a defect 102, then the testing is terminated, and the other defects after the defect 102 on the remaining gate lines 103 will not be detected. From there, the panel will undergo a second round of testing after the detected defect is fixed. If another defect (not shown) is detected in the second round of testing, then the testing is terminated, leaving the remaining gate lines untested, and discarding the panel. Therefore, one will never know whether the panel has additional defects after defect 102. If there is no more defects after defect 102, the discarding the panel results in a waste of material and lowers the yield.

For the forgoing reason, there is a need for a method for simultaneous testing of multiple gate lines on GOA panels. When the gate lines may be tested simultaneously, the probability of bypassing a possible defect during testing is greatly reduced.

SUMMARY

The present invention provides a method for testing liquid crystal displays, that it satisfies this need of simultaneously testing pixels on the LCD panel which the gate drivers are integrated on it. The embodiment of the present invention connects clock signal inputs, inverted clock signal inputs, and pull down signal inputs of the gate drivers in the selected area to a clock signal testing pad, an inverted clock signal testing pad, and a pull down signal testing pad. Thus, clock signals, inverted clock signals, and pull down signals are simultaneously inputted into the clock signal inputs, the inverted clock signal inputs, and the pull down signal inputs of the gate drivers in the selected area. Similarly, connect the start pulse inputs of the gate drivers in the selected area to a start pulse testing pad, and input a start pulse signal into the start pulse inputs of the gate drivers in the selected area. The above mentioned selected area may be the entire panel. When the above mentioned signals are simultaneously inputted, all pixels connected with the gate lines in the selected area are enabled. When testing signals are simultaneously inputted to the data lines, all the pixels connected with the gate lines in the selected area may be tested simultaneously.

Another embodiment of the present invention is dividing the LCD panel into different sub areas for testing. This embodiment divides the panel into multiple sub areas, wherein each sub area includes at least one gate line. The start pulse inputs of the gate drivers in every sub area are connected onto one start pulse testing pad, and the pull down signal inputs of the gate drivers in the selected area are connected to one pull down testing pad. Therefore, the above mentioned signal may be simultaneously inputted to the gate drivers of different areas, and perform tests in different areas.

Before performing the test, there is no need to disconnect all the signal lines in every sub area, or one may choose to disconnect all the signal lines in every area from each other in order to prevent signals from entering the wrong gate drivers. If one chooses to electrically disconnect all the signal lines in every sub area from each other, after completing the testing procedure, it is necessary to reconnect all the signal lines in every sub area in order to restore the operation of the entire panel.

The present invention provides three ways of electrical disconnection and reconnection as an example, all other structure or methods used to electrically disconnect and reconnect the signal lines my be applied. Take the start pulse (any of the clock signal, inverted clock signal, and pull down signal is the same) as an example, the first way is forming a soldering junction between the start pulse signal lines. After completing the testing procedure, reconnect all the start pulse signal lines back together using a solder connection. The second way is forming a metal oxide semiconductor junction between the start pulse signal lines. After completing the testing procedure, use a voltage to punch through the semiconductors to reestablish the connection. The third way is to divide the panel into different sub areas without electrical disconnection. This method is to disable the non-testing gate lines via the pull down signal, so that the start pulse cannot enable the gate drivers not under testing. Although the electrical disconnection and reconnection method are as described above, they should not limit the present invention.

All the testing pads in the present invention including the clock signal testing pad, the inverted clock signal testing pad, the pull down signal testing pad, and the start pulse testing pad are formed on the non-operating sub area of the panel, thus are removed following the completing the testing procedure.

The embodiment of the present invention provides a method for testing LCD panels. This method may simultaneously test multiple gate lines, as result of eliminating any blind spots in the previously untested areas. Also, this method may increase the testing efficiency, preventing discarding panels with only two defective spots, rather may detect all defects for repair. In addition, the speed of testing is faster than before due to simultaneously testing capability of this method.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
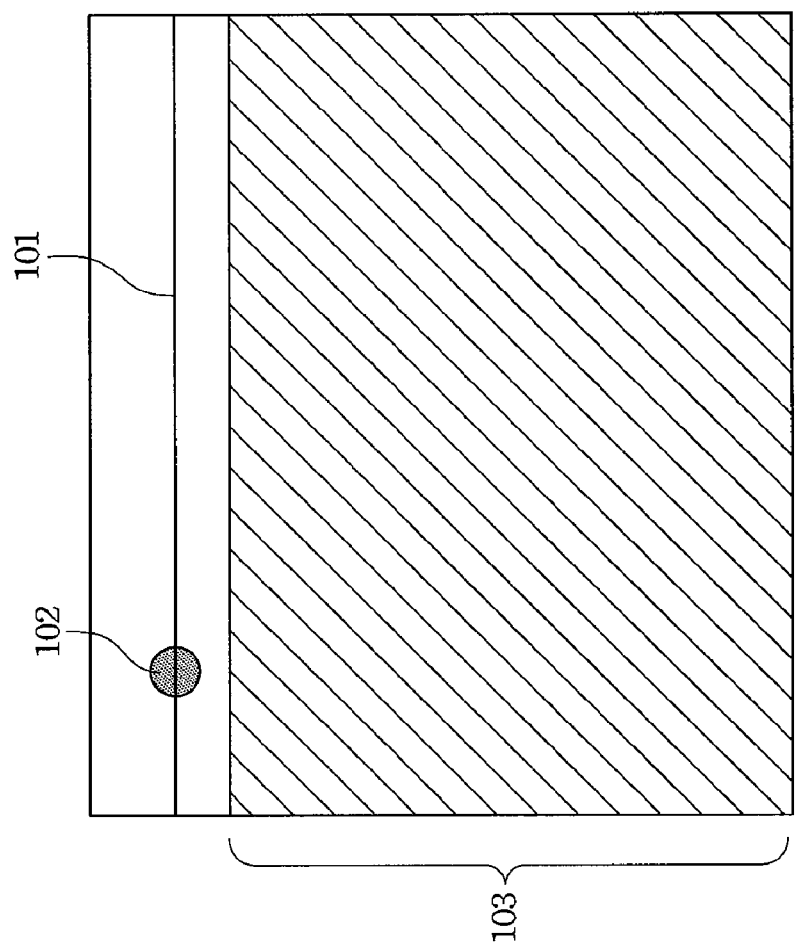
FIG. 1 is a diagram of the current testing method of the GOA panel.

Reference will be made in detail to the present preferred embodiments of the invention, examples of which are illustrated in the accompanying drawings. Wherever possible, the same reference numbers are used in the drawings and the description to refer to the same or like parts.

The embodiment of the present invention provides a method for testing LCD panels, wherein when the gate drivers are integrated onto the LCD panels, simultaneously testing pixels on multiple gate lines. The first embodiment of the present invention is electrically connecting the clock signal inputs, the inverted clock signal inputs, the pull down signal inputs, and the start pulse inputs of the gate drivers in the selection areas on the LCD panel to the corresponding testing pads. When the gate drivers enable the gate lines, tests may be performed to the pixels.

Figure 2:
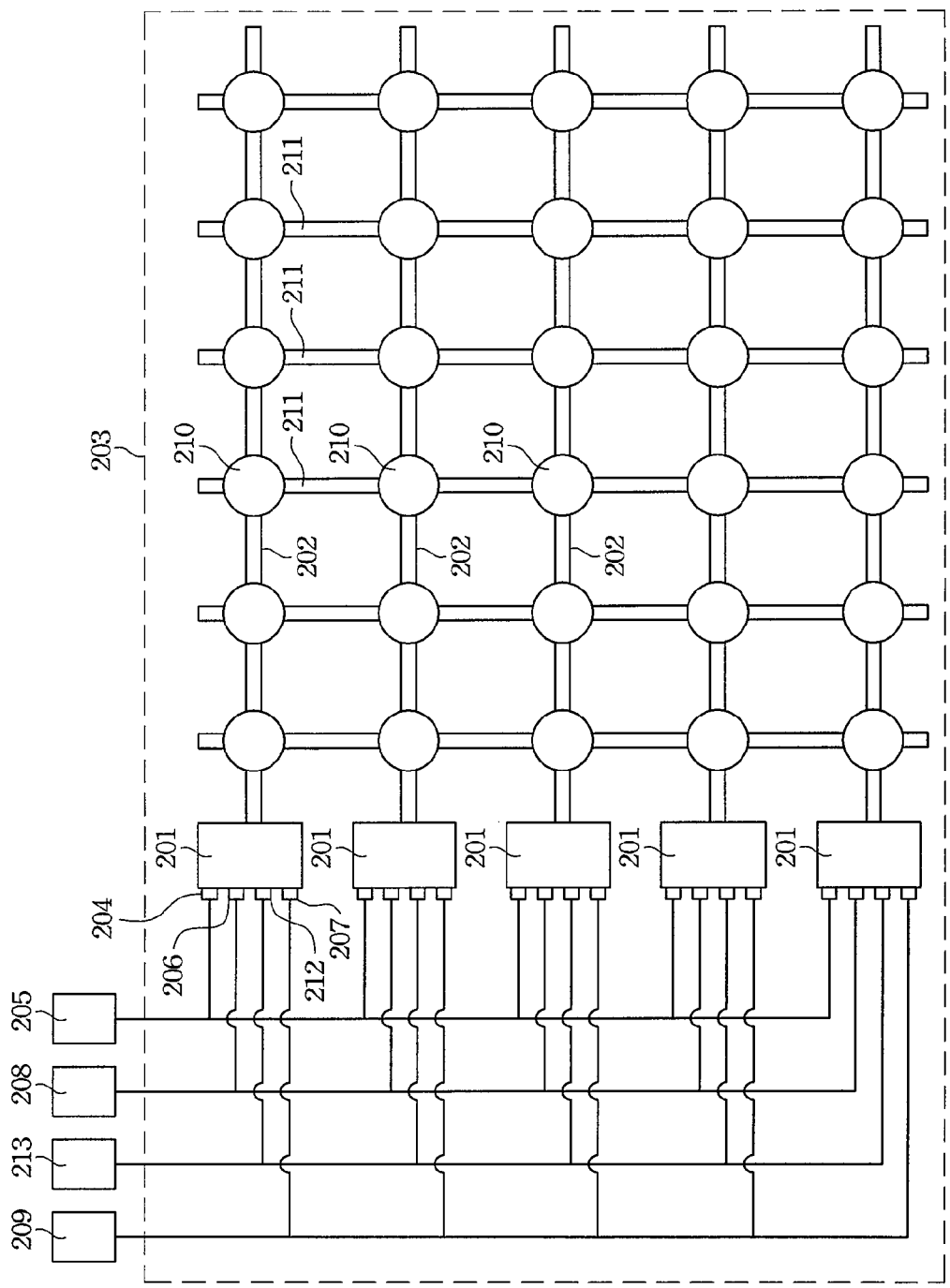
FIG. 2 is a diagram of a selected area on the LCD panel according to the first embodiment of the present invention.

FIG. 2 is a diagram of a selected area on the LCD panel according to the first embodiment of the present invention. The gate drivers 201 and gate lines 202 are integrated onto the panel 203. Electrically connect the clock signal inputs 204 of the gate drivers 201 to a clock testing pad 205. This testing pad 205 may extend beyond the panel glass 203 for inputting the clock signal. Similarly, the inverted clock signal input 206, the pull down signal input 212 and the start pulse input 207 may also be connected in the same fashion. Electrically connect the inverted clock signal inputs 206 of the gate drivers 201 to an inverted clock testing pad 208. This testing pad 208 may extend beyond the panel glass 203 for inputting the inverted clock signal. Electrically connect the pull down signal inputs 212 of the gate drivers 201 to a pull down signal testing pad 213. This testing pad 213 may extend beyond the panel glass 203 for inputting the pull down signal. Electrically connect the start pulse inputs 207 of the gate drivers 201 to a start pulse testing pad 209. This testing pad 209 may extend beyond the panel 203 for inputting the start pulse. When the clock signal, the inverted clock signal, the pull down signal, and the start pulse are inputted to the clock signal testing pad 205, the inverted clock signal testing pad 208, the pull down signal testing pad 213, and the start pulse 209, the gate driver 201 then enables the pixels 210 on the gate lines 202 in the selected area. The test signal is sent to all the data lines 211. All the pixels 210 in the selected area experience a testing voltage simultaneously. In FIG. 2, the selected area is zoomed in for better explanation, it is not meant to limit the selected area to the illustration. The selected area may include all the gate lines on the entire LCD panel.

Figure 3:
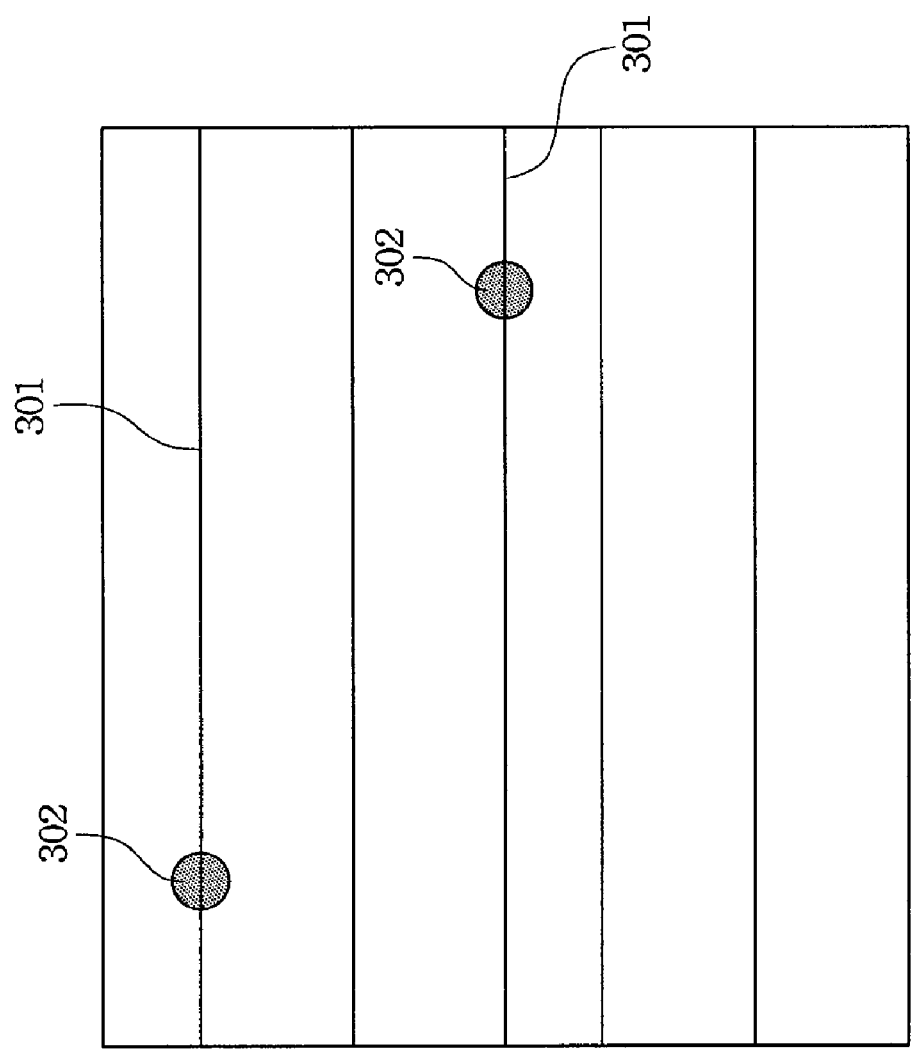
FIG. 3 is a diagram of the GOA panel under testing using the disclosed method.

FIG. 3 is a diagram of the GOA panel under testing. When it is possible to simultaneously test all the gate lines 301, all the defects 302 on the panel may be detected, thereby eliminating all the blind spots. The second embodiment of the present invention is to divide the LCD panel into multiple sub areas for testing.

Figure 4:
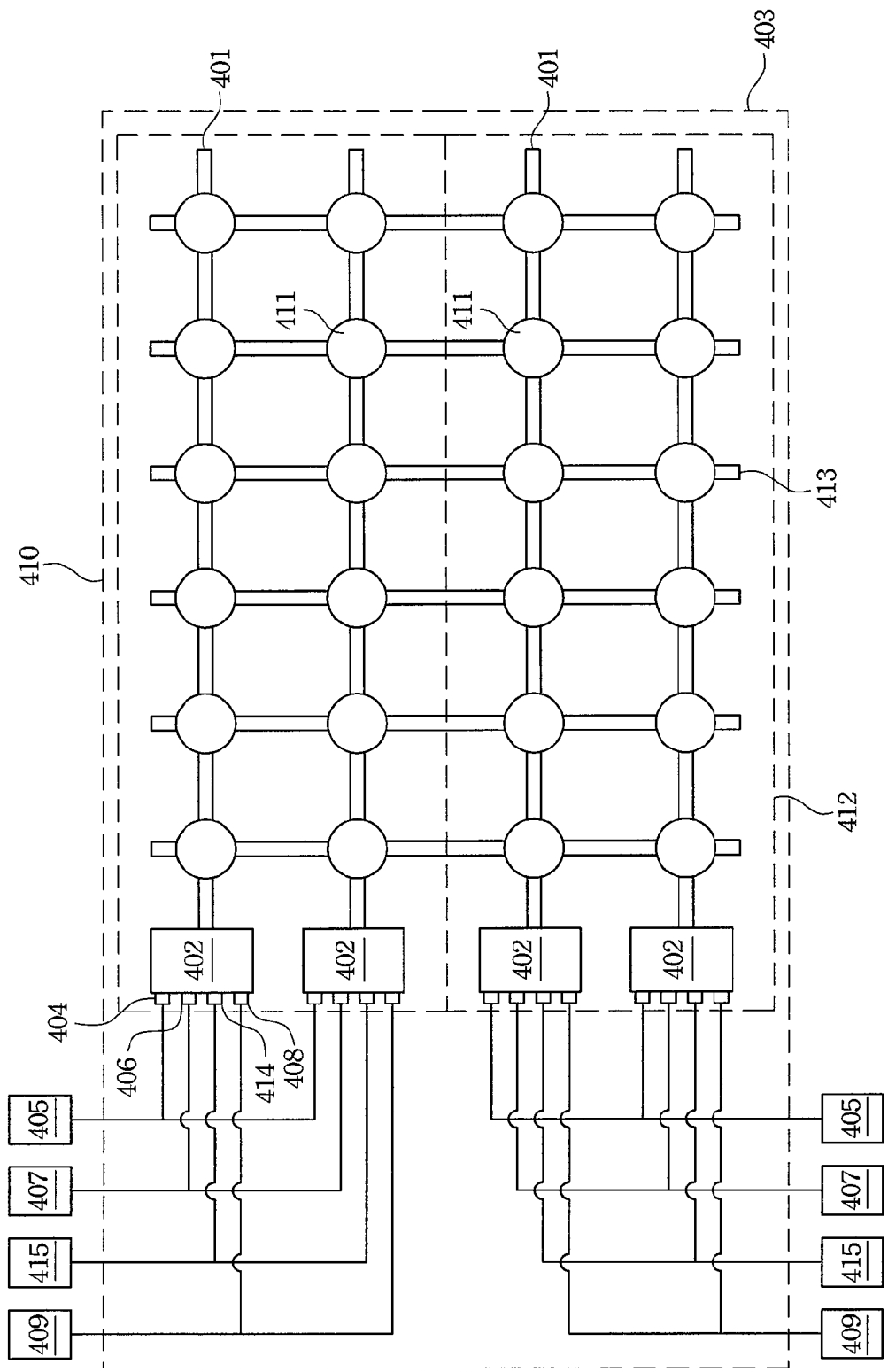
FIG. 4 is a diagram of the LCD panel according to the second embodiment of the present invention.

FIG. 4 is a diagram of the LCD panel according to the second embodiment of the present invention. Every sub area includes at least one gate line 401. Gate drivers 402 and gate lines 401 are integrated onto the panel 403. For example, the panel is divided into two sub areas to illustrate the dividing point of the two sub areas. The clock signal inputs 404 of the gate driver 402 in the each of the sub areas are electrically connected to a clock signal testing pad 405. The testing pad 405 may extend beyond the panel glass 403, and the testing pad 405 is used for inputting the clock signal. The inverted clock signal inputs 406 of the gate driver 402 in the each of the sub areas are electrically connected to an inverted clock signal testing pad 407. The testing pad 407 may extend beyond the panel glass 403, and the testing pad 407 is used for inputting the inverted clock signal. The pull down signal inputs 414 of the gate driver 402 in the each of the sub areas are electrically connected to a pull down signal testing pad 415. The testing pad 415 may extend beyond the panel glass 403, and the testing pad 415 is used for inputting the pull down signal. The start pulse inputs 408 of the gate driver 402 in the each of the sub areas are electrically connected to a start pulse testing pad 409. The testing pad 409 may extend beyond the panel glass 403, and the testing pad 409 is used for inputting the start pulse.

The entire start pulse testing pad 409, the clock signal testing pad 405, the inverted clock signal testing pad 407, and the pull down signal testing pad 415 are electrically disconnected therebetween. For example, when the start pulse is sent to the start pulse testing pad 409 of sub area 410, the clock signal is sent to the clock signal testing pad 405 of sub area 410, the inverted clock signal is sent to the inverted clock signal testing pad 407 of sub area 410, and the pull down signal is sent to the pull down signal testing pad 415 of sub area 410, the gate drivers in the sub area 410 starts to enable the gate lines 401 in the sub area 410 and the pixels 411 thereon. A test signal is sent to the data lines 413 in all sub areas. The pixels 411 in sub area 410 then experience a test voltage to perform tests. After the testing in sub area 410 is finished, another set of start pulse is sent to the start pulse testing pad 409 in sub area 412, the clock signal is sent to the clock signal testing pad 405 in sub area 412, the inverted clock signal is sent to the inverted clock signal testing pad 407 in sub area 412, and the pull down signal is sent to the pull down signal testing pad 415 in sub area 412, while disabling the gate lines 401 in area 410. The gate drivers 402 in area 412 then start driving the gate lines 401 in area 412 and the pixels 411 thereon. The test signal is sent to the data lines in all sub areas, all the think film semiconductors 411 in sub area 412 then simultaneously experience the test voltage. The sequence of testing is not limited to starting from the top sub areas down, but may start from the bottom sub area up, or may start testing from the top and bottom sub areas at the same time.

Accordingly, the sub areas on the LCD panel are tested separately. When all the sub areas are finished testing, the signal lines in all the sub areas are electrically reconnected.

Figure 5:
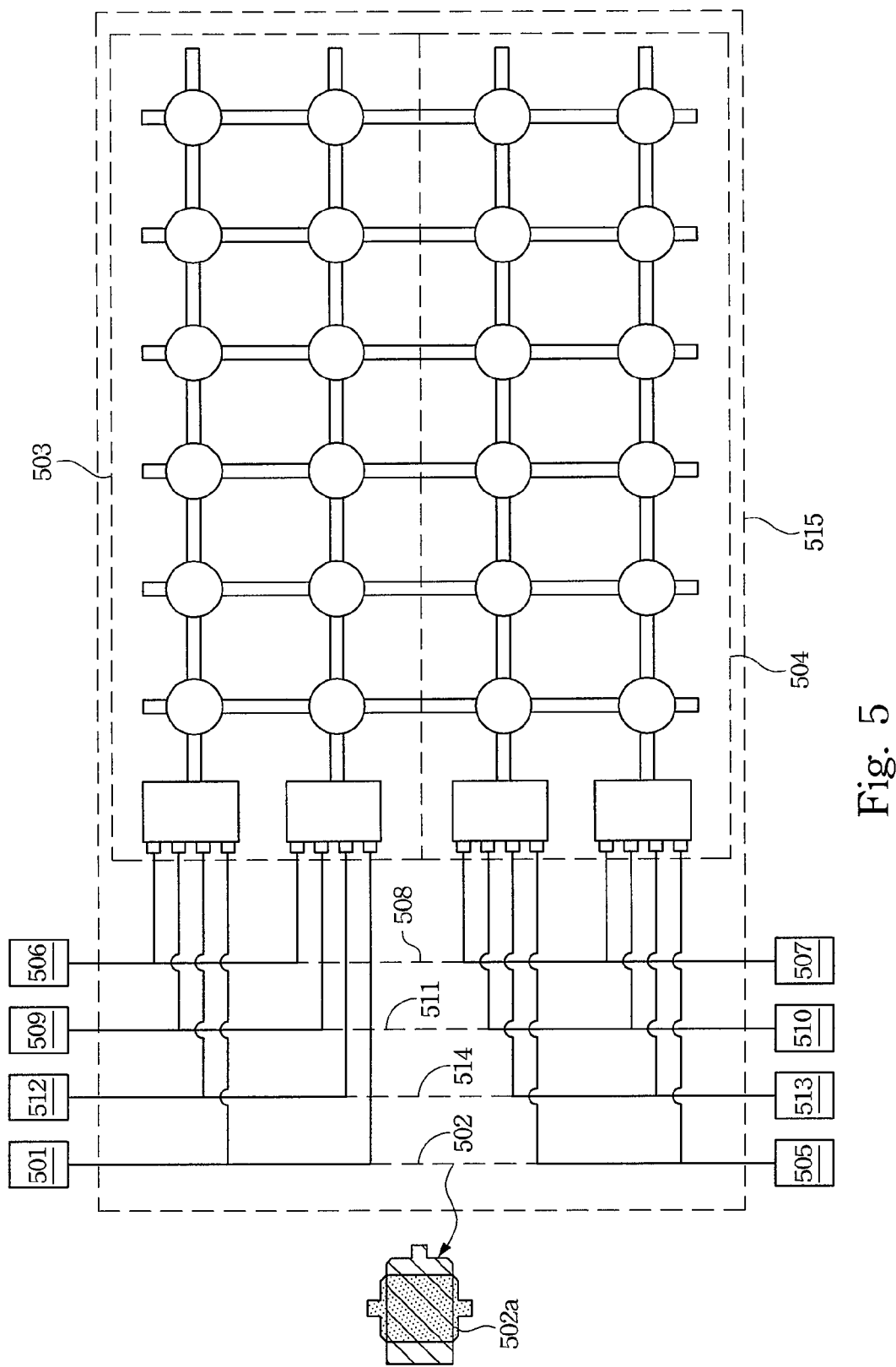
FIG. 5 is a diagram of a soldering junction between the divided sub areas of the LCD panel according to the second embodiment of the present invention.

In the above mentioned second embodiment, in order to electrically disconnect the testing pads between the sub areas, and electrically connecting therewith, two ways may serve this purpose. First, referring to FIG. 5, there is shown a diagram of a soldering junction between the divided sub areas of the LCD panel according to the second embodiment of the present invention. This example shows the forming of a soldering junction 502 between the start pulse testing pads 501 and 502, a soldering junction 508 between the clock signal testing pads 506 and 507, a soldering junction 511 between an inverted clock signal testing pad 509 and 510, and a soldering junction 514 between the pull down signal testing pad 512 and 513. All the solder junctions are disposed on the panel glass 515 (operating area of the substrate). Take junction 502 as an example, a zoomed in diagram 502A is indicated by the arrow. Other soldering junctions have the same resemblance as in diagram 502A. For example, the soldering junction 502, 508, 511, and 514 in sub area 503 and sub area 504 prevent the signals on the start pulse testing pad 501, the clock signal testing pad 506, the inverted clock signal testing pad 509, and the pull down signal testing pad 512 from sending to the start pulse testing pad 505, the clock signal testing pad 507, the inverted clock signal testing pad 510, and the pull down signal testing pad 513. After the tests are finished in all the sub areas, the soldering junctions 502, 508, 511, and 514 are electrically connected by a solder connection. Further testing may follow after, such as full panel testing.

Figure 6:
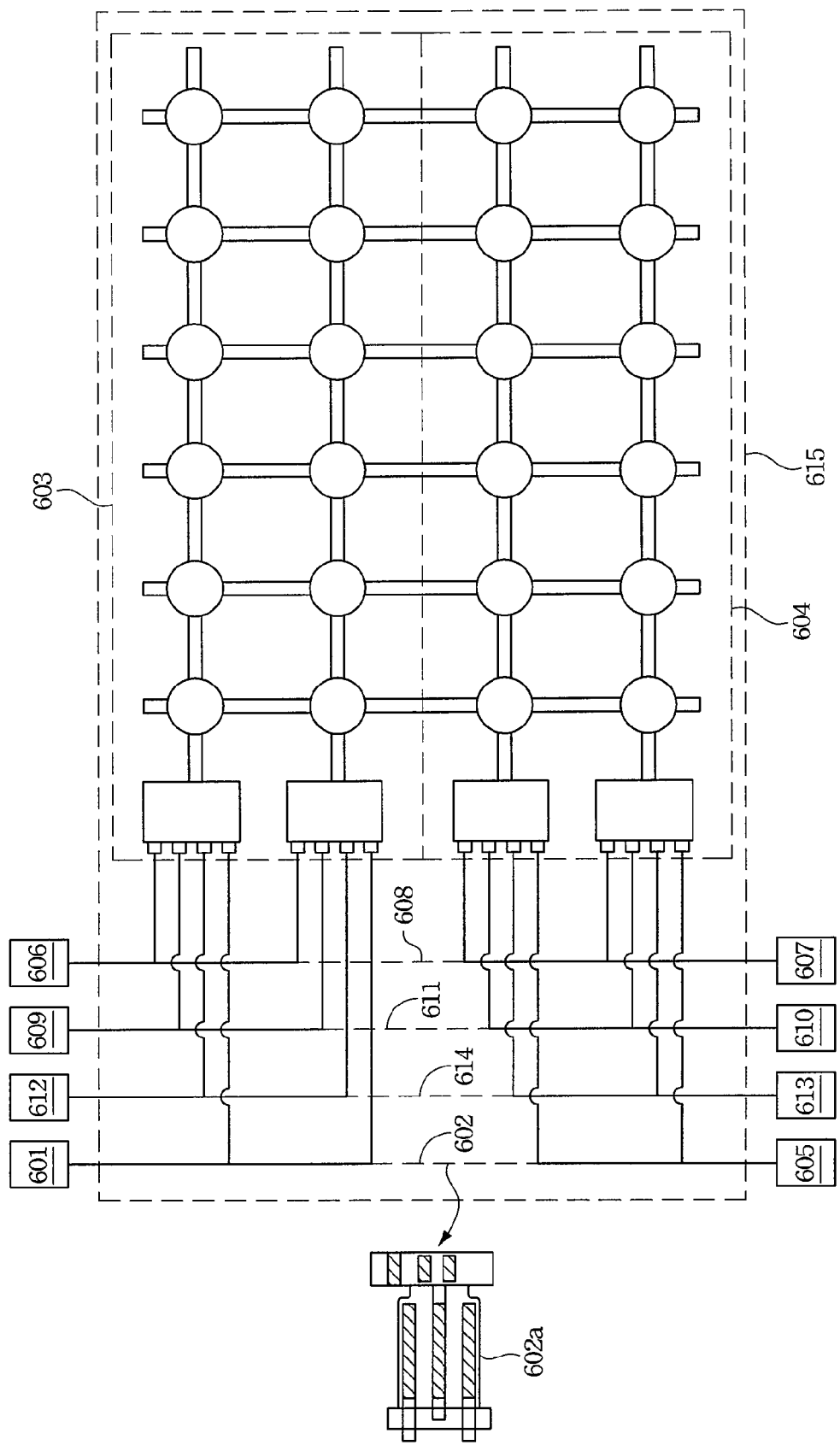
FIG. 6 is a diagram of a metal oxide semiconductor junction in the divided sub areas of the LCD display panel.

The second way is illustrated in FIG. 6, a diagram of a metal oxide semiconductor junction in the divided sub areas of the LCD display panel. The present example is forming a metal oxide semiconductor junction 602 between the start pulse testing pads 601 and 605, a metal oxide semiconductor junction 608 between the clock signal testing pads 606 and 607, a metal oxide semiconductor junction 611 between an inverted clock signal testing pad 609 and 610, and a metal oxide semiconductor junction 614 between the pull down signal testing pad 612 and 613. All the metal oxide semiconductor junctions are disposed on the panel glass 615 (operating area of the substrate). Take junction 602 as an example, a zoomed in diagram 602A is indicated by the arrow. Other soldering junctions have the same resemblance as in diagram 602A. For example, the soldering junction 602, 608, 611, and 614 in sub area 603 and sub area 604 prevent the signals on the start pulse testing pad 601, the clock signal testing pad 606, the inverted clock signal testing pad 609, and the pull down signal testing pad 612 from sending to the start pulse testing pad 605, the clock signal testing pad 607, the inverted clock signal testing pad 610, and the pull down signal testing pad 613. After the tests are finished in all the sub areas, the soldering junctions 602, 608, 611, and 614 are electrically connected when the panels experience the operating voltage, which is higher than the testing signal voltage. The operating voltage can punch through the metal oxide semiconductors. Further testing may follow after, such as full panel testing.

Figure 7:
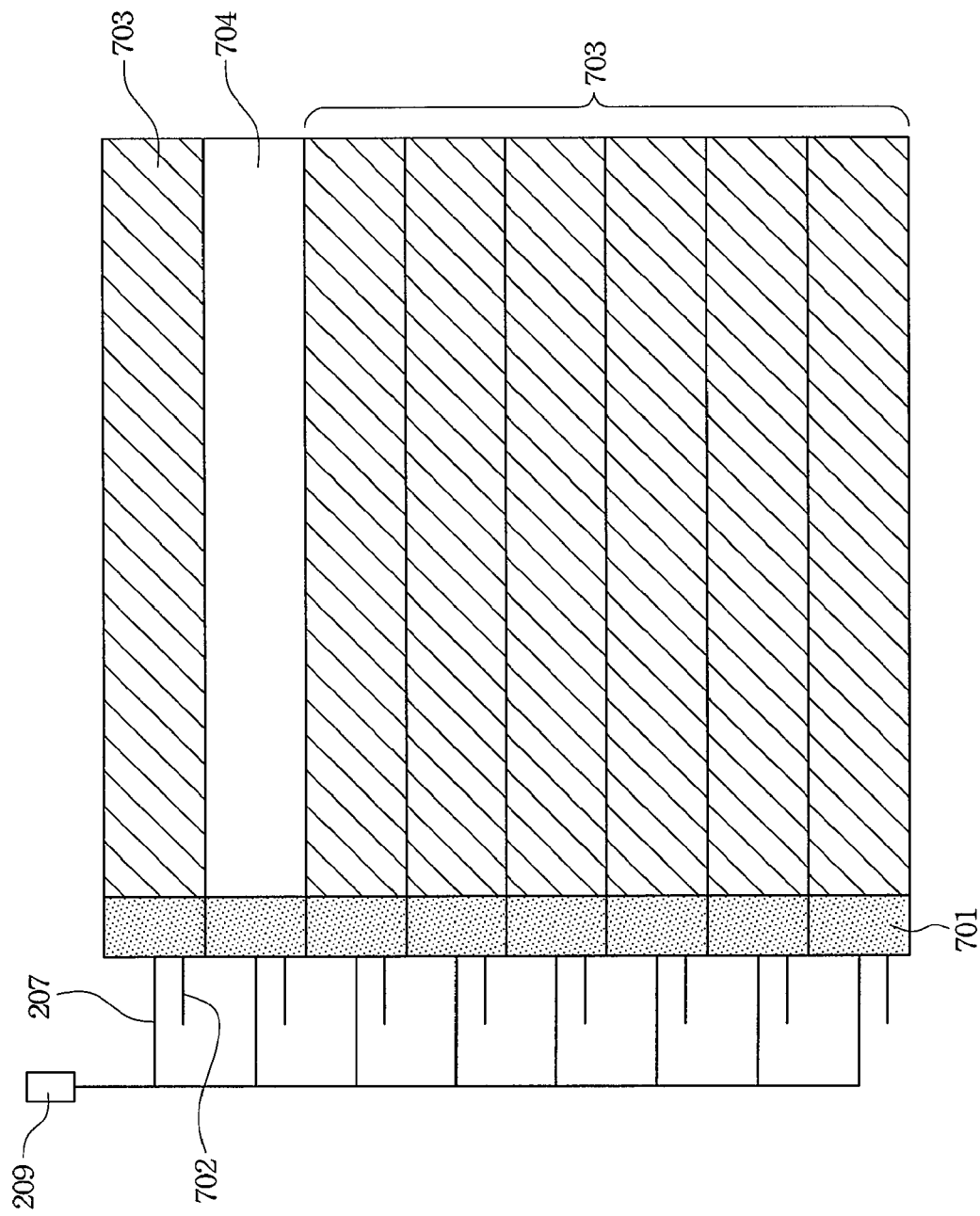
FIG. 7 is a diagram of dividing the LCD panel by the pull down signal according to the second embodiment of the present invention.

The objective of establishing junctions is so that the panel may be divided into sub areas for testing in independent sub areas. However, the pull down signal may be used to enable and disable the non-testing sub areas. FIG. 7 is a diagram of dividing the LCD panel by the pull down signal according to the second embodiment of the present invention. The gate drivers 701 in every sub area may be applied with a pull down signal at the pull down signal inputs 702. The pull down signal may pull the start pulse to ground. Thus, by inputting a pull down signal to the non-testing sub area 703 can allow sub area 704 to be tested independently.

The embodiment of the present invention is a method for testing all the pixels on the GOA LCD panels. When the pixels are simultaneously tested, the testing efficiency is increased, which leads to shorter testing time. In addition, the embodiment of the present invention may prevent wasting of usable materials, thus increasing the panel yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for testing a liquid crystal display panel having a plurality of pixels, a plurality of gate drivers, a plurality of gate lines and a plurality of data lines, wherein each gate driver has a clock signal input, an inverted clock input, a pull down input and a start pulse input and is integrated onto the liquid crystal display panel, the method comprising:
   inputting a clock signal, an inverted clock signal and a pull down signal into a clock signal input, an inverted clock input and a pull down signal input of the plurality of gate drivers in a selected area of the liquid crystal display panel, simultaneously;
   inputting a start pulse into start pulse inputs of the gate drivers to enable the gate lines in the selected area so as to turn on the pixels simultaneously; and
   outputting a test signal from the plurality of data lines simultaneously.

2. The method of claim 1, wherein the clock inputs in the selected area are connected to a clock testing pad.

3. The method of claim 1, wherein the inverted clock inputs in the selected area are connected to an inverted clock testing pad.

4. The method of claim 1, wherein the pull down inputs in the selected area are connected to a pull down testing pad.

5. The method of claim 1, wherein the start pulse inputs in the selected area are connected to a start pulse testing pad.

6. The method of claim 1, further comprising dividing the plurality of gate lines into a plurality of sub areas within the selected area, wherein the clock signal, the inverted clock signal, the pull down signal and the start pulse signal are inputted into each sub areas in a sequence.

7. The method of claim 6, wherein the clock inputs in the sub areas are connected to a clock testing pad.

8. The method of claim 6, wherein the inverted clock inputs in the sub areas are connected to an inverted clock testing pad.

9. The method of claim 6, wherein the pull down inputs in the sub areas are connected to a pull down testing pad.

10. The method of claim 6, wherein the start pulse inputs in the sub areas are connected to a start pulse testing pad.

11. The method of claim 6, wherein each sub area comprises at least one gate line.

12. The method of claim 6, further comprising testing the divided sub areas by inputting the pull down signal into a plurality of gate drivers in the non-testing sub areas to disable the pixels in the non-testing sub areas and allowing the desired testing sub areas to undergo testing, wherein the pixels in the desired testing sub areas are turned on by the start pulse.

13. The method of claim 6, wherein the sequence is starting from the top of the panel to down, from the bottom of the panel to up, or from both the top and the bottom of the panel towards the center of the panel.

14. The method of claim 6, wherein the start pulse testing pads, the clock signal testing pads, the inverted clock signal testing pads, and the pull down signal testing pads are all electrically disconnected.

15. The method of claim 14, further comprising electrically reconnecting the start pulse testing pads, the clock signal testing pads, the inverted clock signal testing pads, and the pull down signal testing pads after completion of the testing.

16. The method of claim 14, wherein electrically disconnecting the testing pads in every sub area comprises forming a metal oxide semiconductor junction electrically connected between two start pulse testing pads, two clock signal testing pads, two inverted clock signal testing pads, and two pull down signal testing pads.

17. The method of claim 14, wherein electrically disconnecting the testing pads in every sub area comprises forming a soldering junction electrically connected between two start pulse testing pads, two clock signal testing pads, two inverted clock signal testing pads, and two pull down signal testing pads.

18. The method of claim 15, wherein electrically reconnecting comprises applying a voltage to the start pulse testing pads, the clock signal testing pads, the inverted clock signal testing pads, and the pull down signal testing pads, to punch through the metal oxide semiconductor junctions.

19. The method of claim 15, wherein electrically reconnecting comprises applying solder to the start pulse testing pads, the clock signal testing pads, the inverted clock signal testing pads, and the pull down signal testing pads, to solder connect the soldering junctions.

* * * * *